United States Patent [19]

Mizan et al.

[11] Patent Number: 5,428,326
[45] Date of Patent: Jun. 27, 1995

[54] FAST TURN-ON, TEMPERATURE STABLE DIELECTRIC RESONATOR OSCILLATOR

[75] Inventors: Muhammad A. Mizan, Ocean; Thomas P. Higgins; Dana J. Sturzebecher, both of Tinton Falls, all of N.J.

[73] Assignee: The United States of America as represented by the Secretary of the Army, Washington, D.C.

[21] Appl. No.: 175,335

[22] Filed: Dec. 29, 1993

[51] Int. Cl.[6] .............................................. H01P 7/10
[52] U.S. Cl. ................................ 333/219.1; 333/234; 331/96; 331/107 DP
[58] Field of Search ................. 333/202, 219, 219.1, 333/234; 331/96, 117 D, 107 DP

[56] References Cited

U.S. PATENT DOCUMENTS

| | | | |
|---|---|---|---|
| 4,609,883 | 9/1986 | Mizumura et al. | 331/96 |
| 4,868,488 | 9/1989 | Schmall | 333/219.1 |
| 4,922,211 | 5/1990 | Otremba et al. | 333/219.1 |
| 5,140,285 | 8/1992 | Cohen | 331/96 |
| 5,150,080 | 9/1992 | Bianchini et al. | 331/117 D X |

FOREIGN PATENT DOCUMENTS 0347909 12/1992 Japan ................................. 333/202

OTHER PUBLICATIONS

T. R. Faulkner et al, "Residual Phase Noise and AM Noise Measurements and Techniques", Hewlett-Packard Company, HP Part Number 03048-90044, pp. 2-37 to 2-39, 1990.

M. J. Loboda et al, "Temperature Sensitivity of Dielectric Resonators and Dielectric Resonator Oscillators", 42nd Annual Frequency Control Symposium, IEEE, pp. 263-271, 1988.

A. P. S. Khanna, "Review of Dielectric Resonator Oscillator Technology", 41st Annual Frequency Control Symposium, IEEE, pp. 478-486, 1987.

*Primary Examiner*—Seungsook Ham
*Attorney, Agent, or Firm*—Michael Zelenka; William H. Anderson

[57] ABSTRACT

The dielectric resonator assembly includes a housing having interior surfaces defining a resonant cavity and a dielectric resonator within the cavity. The dielectric resonator is a ceramic having a high dielectric constant and generates pulses at a desired frequency of oscillation. A pedestal supports the dielectric resonator within the resonant cavity so that it spaces the resonator apart from each of the interior surfaces of the cavity. The assembly also includes a transmission line for transmitting the pulses which pass through at least one of the interior surfaces and has an interior portion spaced apart from the remaining interior surfaces of the cavity. The interior portion of the transmission line is positioned proximate to and in magnetically coupled relationship with the dielectric resonator.

10 Claims, 2 Drawing Sheets

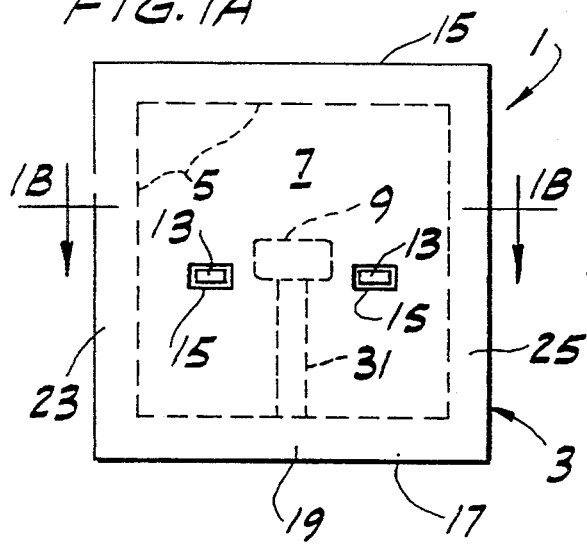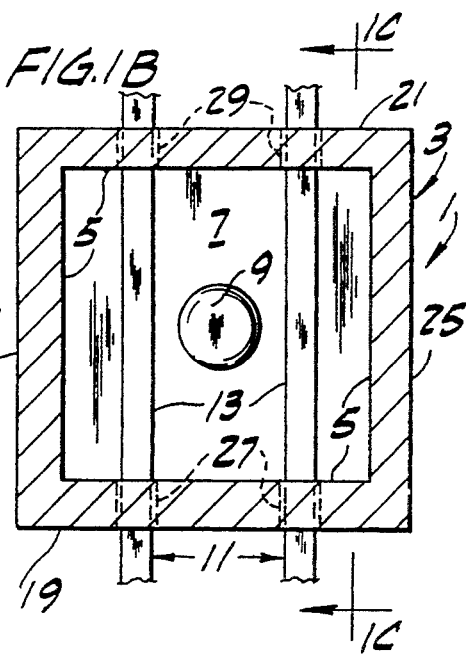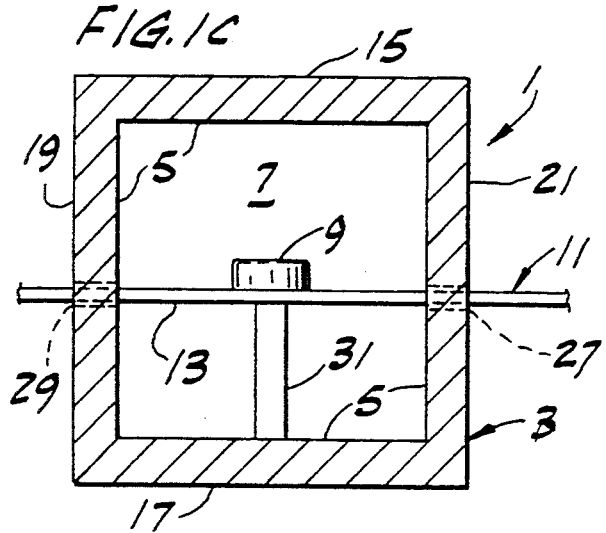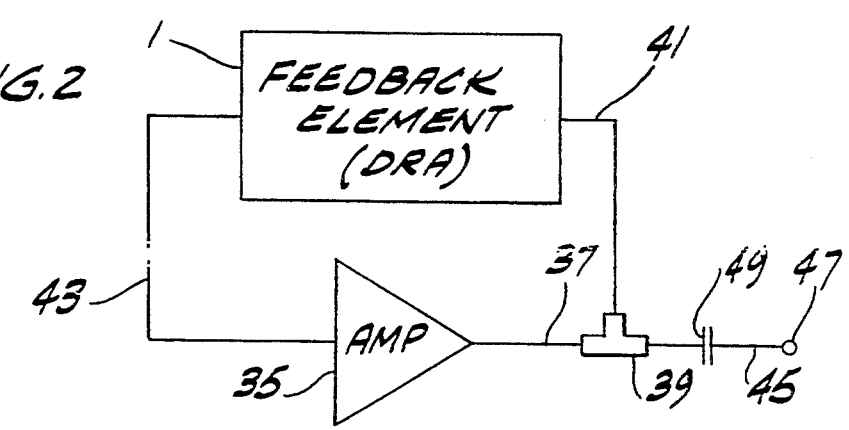

FAST TURN-ON, TEMPERATURE STABLE DIELECTRIC RESONATOR OSCILLATOR

GOVERNMENT INTEREST

The invention described herein may be manufactured, used, and licensed by or for the Government of the United States of America without the payment to us of any royalty thereon.

FIELD OF THE INVENTION

This invention relates in general to microwave oscillator circuits and, particularly, to an improved microwave oscillator circuit exhibiting improved turn-on delays and temperature stability.

BACKGROUND OF THE INVENTION

Microwave oscillator circuits provide energy at microwave frequencies for various systems, including communication, radar and navigation systems. In addition to an active amplifier element, a dielectric resonator oscillator includes a resonant circuit having a dielectric resonator made of a ceramic material for determining the frequency of oscillation. The primary characteristics of the resonant circuit are its quality factor Q and the ceramic material's temperature coefficient $\tau_f$ and dielectric constant $\epsilon_r$.

In general, designers of dielectric resonator oscillators may select various resonant circuits with different Q, $\tau_f$ and $\epsilon_r$ values depending on design requirements. Typical dielectric resonant circuits have high dielectric constants (e.g., between 37 and 100) and high quality factors (e.g., 10,000 at 10 GHz). The dimensions of a dielectric resonator and its environment determine resonant frequency which generally ranges from 1 GHz to 100 GHz.

Conventional dielectric resonator oscillators, however, have an inherent delay time after being turned on before a full power oscillation is generated. As is well known in the art, an oscillator employs positive feedback to continuously recirculate an amplified signal through the resonant circuit to build up oscillations. In general, the amplified signal must recirculate many times after the oscillator's active device is turned on before a pulse begins to rise. For this reason, the resonant circuit introduces a delay of several microseconds and, thus, limits the oscillator's performance.

Generally, Q is $2\pi$ times the ratio of maximum stored energy to the energy dissipated per cycle at a given frequency. Thus, the time delay through a resonant circuit is directly proportional to its loaded Q factor (the loaded Q of a system is the value of Q obtained when the system is coupled to a device that dissipates energy). For this reason, an oscillator having a lower Q factor provides a faster turn-on time. However, conventional oscillators having lower Q factors for providing faster turn-on times are more sensitive to temperature variations and perform inadequately over a broad range of temperatures.

SUMMARY OF THE INVENTION

Accordingly, an object of the present invention is to provide an improved microwave source having a relatively fast turn-on time.

Another object of the present invention is to provide an improved microwave source which is relatively temperature stable.

These and other objects of the invention are achieved by a dielectric resonator assembly according to the present invention. The dielectric resonator assembly includes a housing having interior surfaces defining a resonant cavity and a dielectric resonator within the cavity. The dielectric resonator is a ceramic having a high dielectric constant and generates pulses at a desired frequency of oscillation. A pedestal supports the dielectric resonator within the resonant cavity so that it spaces the resonator apart from each of the interior surfaces of the cavity. The assembly also includes a transmission line for transmitting the pulses which passes through at least one of the interior surfaces and has an interior portion spaced apart from the remaining interior surfaces of the cavity. The interior portion of the transmission line is positioned proximate to and in magnetically coupled relationship with the dielectric resonator.

Alternatively, the invention may comprise various other systems and methods. Other objects and features will be in part apparent and in part pointed out hereinafter.

BRIEF DESCRIPTION OF THE DRAWINGS

FIGS. 1A-C are fragmentary front, top and side views of the dielectric resonator assembly according to the present invention.

FIG. 2 is a partial block and partial schematic diagram of a dielectric resonator oscillator according to the present invention, including the dielectric resonator assembly as shown in FIG. 1.

Some of the elements of the Figures have not been drawn to scale for purposes of illustrating the invention. Moreover, corresponding reference characters indicate corresponding parts throughout the drawings.

DETAILED DESCRIPTION

Figure 3:
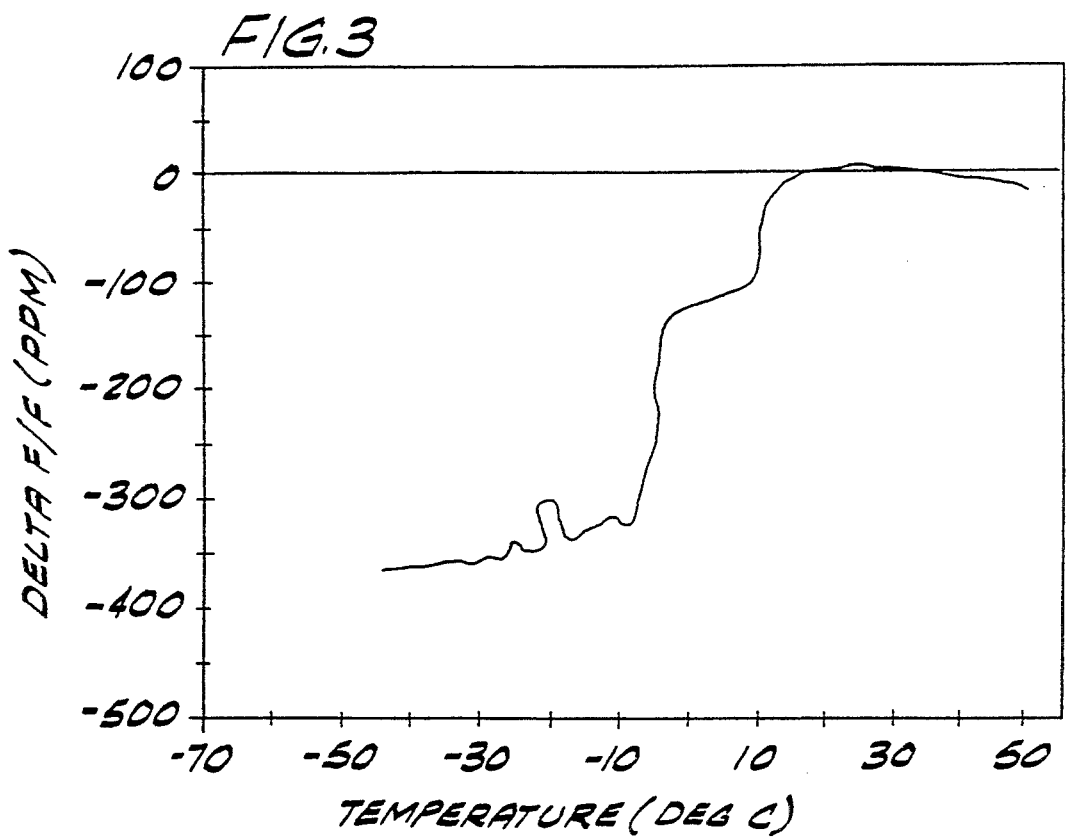
FIG. 3 is a graphical illustration of prior art temperature sensitivity.

FIGS. 1A-C show a preferred embodiment of a dielectric resonator assembly 1 according to the invention. The dielectric resonator assembly 1 constitutes a passive resonant circuit and may be used as the parallel feedback element in a dielectric resonator oscillator (shown in FIG. 2). FIG. 1A is a fragmentary front view of dielectric resonator assembly 1. FIG. 1B is a fragmentary top plan view taken generally along lines 1B—1B of FIG. 1A. FIG. 1C is a fragmentary side elevational view of dielectric resonator assembly 1 taken generally along line 1C—1C of FIG. 1B.

Dielectric resonator assembly 1 includes a metalized housing 3 having interior surfaces 5 defining a resonant cavity 7. Further, resonator assembly 1 includes a frequency determining element, namely, a dielectric resonator 9. Preferably, the dielectric resonator 9 is made from a material having a high dielectric constant relative to low dielectric materials such as air (for air, $\epsilon_r = 1.0$). As is well known in the art, various forms of ceramic are suitable for dielectric resonators in oscillators.

Referring to FIGS. 1A-C, dielectric resonator 9 is preferably a solid cylinder of material located centrally within the resonant cavity 7 and spaced apart from the interior surfaces 5 of the housing 3. In one preferred embodiment of the invention, parallel microstrip transmission lines 11 have interior portions 13 passing through the side walls of resonant cavity 7. The interior portions 13 of the microstrip transmission lines 11 span opposing interior surfaces 5 across cavity 7. Further, interior portions 13 are in close proximity to dielectric resonator 9 and in a magnetically coupled relationship therewith. The Q factor of a resonant circuit is determined largely based on the proximity of transmission lines 11 to dielectric resonator 9. According to the present invention, a lower Q factor may be achieved for resonant cavity 7 by positioning interior portions 13 of transmission lines 11 in close proximity to dielectric resonator 9.

Preferably, transmission lines 11 are a pair of thin 50 Ω microstrips, each having a top conductor supported by a wider dielectric strip; the dielectric strip may be $2\frac{1}{2}$ to 3 times the width of the top conductor of transmission lines 11. Transmission lines 11 also provide a ground plane on the reverse side of each dielectric strip wherein the dielectric strip separates the conductor from the ground plane. As described above, interior portions 13 of the microstrip transmission lines 11 span opposing interior surfaces 5 across cavity 7. In this manner, interior portions 13 are spaced apart from interior surfaces 5 of housing 3. In a preferred embodiment of the invention, housing 3 comprises a top wall 15 opposing a bottom wall 17, opposing front and back walls 19, 21 and opposing side walls 23, 25. As shown in FIGS. 1B and 1C, opposing walls 19, 21 of housing 3 includes generally centrally located openings 27, 29, respectively. Transmission lines 11 input and output housing 3 via the openings 27 and 29, respectively, and extend across resonant cavity 7 in close proximity to dielectric resonator 9 and generally centrally spaced between interior surfaces 5 of top 15 and bottom 17 and between opposing walls 23, 25.

FIGS. 1A and 1C further show a pedestal 31 supporting dielectric resonator 9 at a central location within resonant cavity 7, generally equally spaced between the opposing walls. Preferably, cavity 7 is filled with air or some other low dielectric material and the pedestal 31 likewise has a low dielectric constant. In this manner, dielectric resonator 9 has a much greater dielectric constant than the material by which it is immediately surrounded.

As described above, microwave oscillators typically include an active element (e.g., an amplifier) and a passive element (e.g., a positive feedback resonant circuit) and are commonly used as pulsed radio frequency sources. Such oscillators may be selectively switched on by applying proper voltage bias to the gates of the active element devices. The resonant feedback element of an oscillator preferably has a narrow bandwidth and the amplified signal continuously recirculates through the resonant feedback element to generate oscillations. Since a signal recirculates many times from the time the active element is turned on until a pulse begins to rise, the resonant feedback element may introduce a delay of several microseconds. Faulkner et al., in "Residual Phase Noise and AM Noise Measurements and Techniques," *Hewlett-Packard Application Notes*, 1990, HP part #03048-90044, the entire disclosure of which is incorporated herein by reference, teach that the time delay associated with a resonator is, $$\tau = \frac{Q}{\pi f_0}$$

where $f_0$ is the operating frequency, and Q is the loaded Q of the resonant circuit.

Loboda et al., in "Temperature Sensitivity of Dielectric Resonators and Dielectric Resonator Oscillators," *42nd Annual Frequency Control Symposium Digest*, 1988, p. 263, the entire disclosure of which is incorporated herein by reference, disclose methods for constructing conventional dielectric resonator assemblies. One method for constructing a dielectric resonator assembly for a microstrip circuit includes positioning a dielectric resonator directly on a dielectric substrate between 50 Ω transmission lines. The substrate is then positioned at the bottom of the metalized housing defining the resonator cavity. The first method generally provides a low Q ($\approx 150$), which is necessary for a fast turn-on oscillator, but detrimentally affects the temperature stability of the oscillator. Another method for constructing conventional dielectric resonator oscillators includes again positioning the substrate at the bottom of the metalized housing but elevating the dielectric resonator to the center of the cavity using a low dielectric constant support. When the dielectric resonator is elevated, the effect of temperature changes on the dielectric resonator, substrate and resonant cavity is lessened thereby improving temperature sensitivity. The second method, however, provides the dielectric resonator oscillator with a higher Q and leads to the turn-on problems described above.

The following example shows the effect of a lower Q on the turn-on time of a pulse: A dielectric resonator oscillator with a high Q ($\approx 13,000$) may be pulsed (by pulsing the gate voltage) and the turn-on time measured. Typically, such an oscillator will have a delay of 6.0 μs and a rise time of 8.0 μs for a total of 14 μs from turn-on until full radio frequency power. However, an oscillator having a lower Q ($\approx 1000$) will typically exhibit a delay of 1.1 μs and a rise time of 0.4 μs for a total of 1.5 μs from turn-on until full power. Therefore, decreasing Q by a factor of ten provides an approximately proportional decrease in the turn-on delay time. However, decreasing Q in this manner also contributes to degraded temperature sensitivity in conventional dielectric resonator assemblies. The present invention advantageously provides an approximate tenfold decrease in turn-on time by achieving a much lower Q factor while improving the temperature sensitivity characteristic.

Referring again to FIGS. 1A–C, the present invention shown in these Figures lowers the Q factor of dielectric resonator assembly 1 relative to conventional resonators by suspending transmission lines 11 across cavity 7 proximate to and in magnetically coupled relationship with dielectric resonator 9, Further, according to the present invention, dielectric resonator 9 is spaced apart from the interior surfaces 5 of each of top 15, bottom 17 and opposing walls 19, 21 and 23, 25. In this manner, a dielectric resonator oscillator having dielectric resonator assembly 1 as its positive feedback element provides improved temperature sensitivity characteristics in a fast turn-on oscillator.

FIG. 2 illustrates one preferred embodiment of the invention configured as a parallel feedback, dielectric resonator oscillator 33 having a transmission-type dielectric resonator assembly 1 with one input/one output shown. Preferably, a two-stage amplifier, shown at reference character 35 activates the dielectric resonator oscillator 33. Dielectric resonator oscillator 33 includes dielectric resonator assembly 1 as the positive feedback element. In operation, the amplifier 35 is pulsed on and its output via line 37 is split by a power divider circuit resonator materials. The entire disclosure of the Khanna article is incorporated herein by reference.

TABLE 1

| COMPOSITION | $\epsilon_r$ | Q | $\tau_f$ | FREQUENCY RANGE |
|---|---|---|---|---|
| $Ba_2Ti_9O_{20}$ | 40 | 10,000 at 4 GHz | +2 | 1 to 100 GHz |
| $(Zr-Sn)TiO_4$ | 38 | 10,000 at 4 GHz | −4 to 10 | 1 to 100 GHz |
| $Ba(Zn_{\frac{1}{3}}Ta_{\frac{2}{3}})O_2$ | 30 | 10,000 at 10 GHz | 0 to 10 | 4 to 100 GHz |
| $Ba(Mg_{\frac{1}{3}}Ta_{\frac{2}{3}})O_2$ | 25 | 25,000 at 10 GHz | 4 | 4 to 100 GHz |
| $BaO-PbO-Nd_2O_3-TiO_2$ | 88 | 5,000 at 1 GHz | 0 to 6 | <4 GHz |
| $Al_2O_3$ | 11 | 50,000 at 10 GHz | 0 to 6 | >18 GHz |

39. A portion of the amplified output signal via line 37 is fed back through dielectric resonator assembly 1 via line 41 and then input to amplifier 35 via line 43. The remaining portion of the amplified signal via line 37 is output via line 45 to a terminal 47 forming the output of oscillator 33. Alternately, the output signal via line 45 may be conditioned by a DC blocking capacitor 49 before being output. In one preferred embodiment of the invention, amplifier 35 comprises a pair of MESFET's in a common source configuration and parallel feedback fabricated on a polytetrafluoroethylene (PTFE) substrate.

Figure 4:
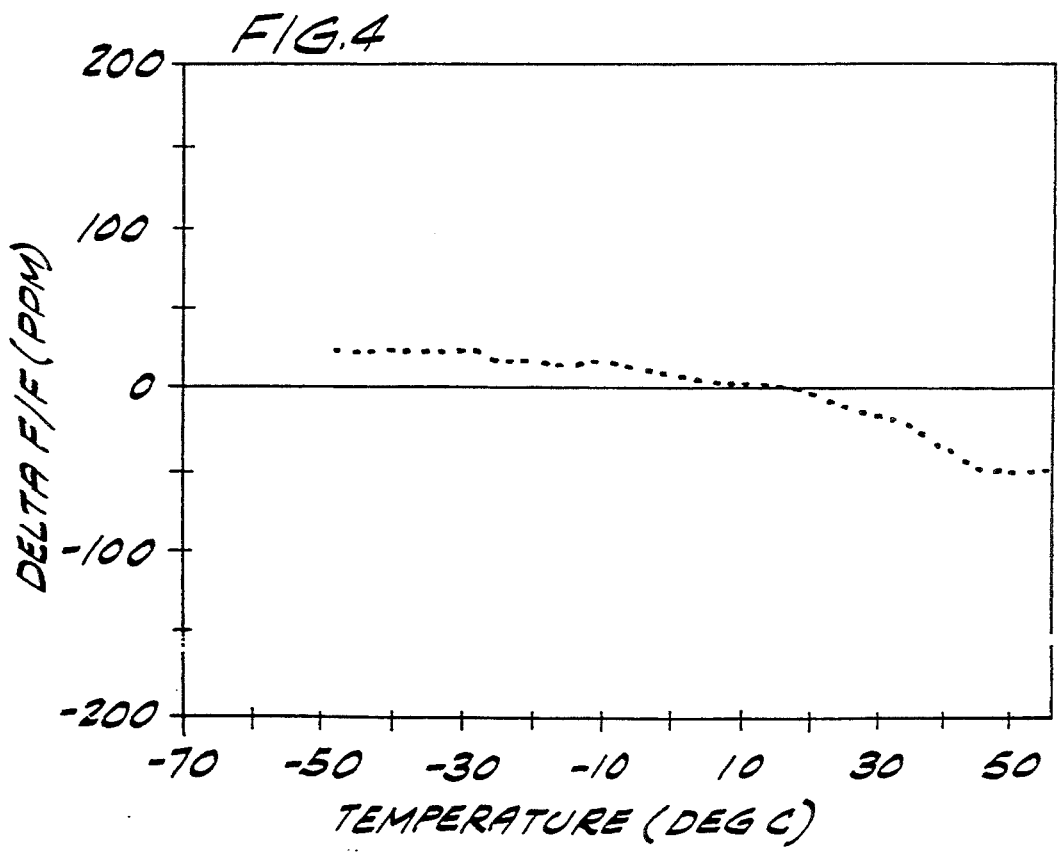
FIG. 4 is a graphical illustration of temperature sensitivity according to the present invention.

FIG. 3 is a graphical illustration of the temperature stability of a conventional fast turn-on oscillator. Temperature sensitivity is measured as a fractional frequency change (delta F/F) in parts per million (PPM). For comparison with conventional oscillators, dielectric resonator oscillator 33 according to the invention may be placed in an environmental chamber, and varied with temperature over a range of −50° C. to +50° C. to experimentally determine its temperature sensitivity. FIG. 4 graphically shows experimental data representing the response of dielectric resonator oscillator 33 to temperature variations. As a comparison of FIGS. 3 and 4 shows, the present invention demonstrates significantly improved temperature stability in addition to having a fast turn-on time. FIG. 4 also illustrates temperature sensitivity measured as a fractional frequency change (delta F/F) in parts per million (PPM).

The present invention is also directed to a method for improving temperature stability of a low-Q microwave oscillator, such as dielectric resonator oscillator 33, and includes the steps of supporting dielectric resonator 9 within resonant cavity 7 on low dielectric constant pedestal 31 and spacing dielectric resonator 9 apart from interior surfaces 5 of resonant cavity 7. The novel method further includes passing transmission lines 11 through resonant cavity 7 via openings 27 in opposing wall 19 and openings 29 in the other opposing wall 21. Openings 27 and 29 are generally centrally located on opposing walls 19, 21 to facilitate the step of spacing interior portions 13 of transmission lines 11 apart from interior surfaces 5 of resonant cavity 7.

It is to be understood that the shape of dielectric resonator 9 is preferably a solid cylinder, but other shapes may also be used such as tubular, spherical and parallelepiped. Further, ceramic mixtures containing $TiO_2$, various Titanates and Zirconates, glass, ceramic systems, alumina-based ceramics as well as complex perouskite compounds with the general formula A(B'$_{\frac{1}{3}}$B''$_{170}$)$O_3$ (where A=Ba, Sr; B'=Zn, Mg, Co, Ni; B''=Ta, Nb) all have acceptable properties for dielectric resonators. Table 1, disclosed by Khanna in "Review of Dielectric Resonator Oscillator Technology," 41st *Annual Frequency Control Symposium Digest*, 1987, p. 478, compares the properties of various dielectric resonator materials. The entire disclosure of the Khanna article is incorporated herein by reference.

It is also to be understood that the present invention may include any number of gain stages in the amplifier 35 section of parallel feedback oscillator 33 and, since the present invention is directed to the relationship between dielectric resonator 9, cavity 7 and microstrip transmission lines 11, other types of three terminal devices (e.g., BJT's, HBT's and HEMT's) for use as amplifier 35 would meet the objects of the invention. In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A dielectric resonator assembly comprising:
   a housing having interior surfaces defining a resonant cavity;
   a dielectric resonator within the resonant cavity, said dielectric resonator comprising a ceramic having a high dielectric constant for generating pulses at a desired frequency of oscillation;
   a pedestal for supporting the dielectric resonator within the resonant cavity so that the resonator is spaced apart from each of the interior surfaces of the resonant cavity; and
   a pair of parallel transmission lines for transmitting the pulses, said transmission lines passing through opposing interior surfaces of the housing, wherein each transmission line having a conductive line disposed on a dielectric substrate, each dielectric substrate passing through the housing at opposite sides of the housing, and each dielectric substrate having a conductive ground plane attached to a side of the dielectric substrate that is opposite the conductive line, wherein the transmission line is proximate to and in a magnetically coupled relationship with the dielectric resonator, and wherein the dielectric resonator is disposed between the parallel transmission lines.

2. The assembly of claim 1 wherein the pedestal comprises a material having a low dielectric constant.

3. The assembly of claim 1 wherein the dielectric resonator comprises a cylinder of ceramic having a high dielectric constant.

4. The assembly of claim 1 wherein the pedestal supports the dielectric resonator substantially centrally located within the resonant cavity whereby temperature stability of said dielectric resonator assembly is improved.

5. The assembly of claim 4 wherein said dielectric resonator assembly has a turn-on delay associated with a Q factor and wherein the interior portion of the transmission line is substantially centrally located within the resonant cavity proximate to the dielectric resonator whereby the Q factor of said dielectric resonator assembly is decreased thereby decreasing the turn-on delay.

6. The assembly of claim 1 wherein the housing is metallic.

7. The assembly of claim 1 wherein the resonant cavity is filled with a material having a low dielectric constant.

8. The assembly of claim 1 wherein the dielectric substrate is wider than the conductive line.

9. The assembly of claim 1 wherein the dielectric substrate has a width 2.5 to 3 times greater than the width of the conductive line.

10. A dielectric resonator oscillator comprising:
a housing having interior surfaces defining a resonant cavity;
a dielectric resonator within the resonant cavity, said dielectric resonator comprising a ceramic having a high dielectric constant for generating pulses at a desired frequency of oscillation;
a pedestal for supporting the dielectric resonator within the resonant cavity so that the resonator is spaced apart from each of the interior surfaces of the resonant cavity;
a pair of parallel transmission lines for transmitting the pulses, said transmission lines passing through opposing interior surfaces of the housing, wherein each transmission line having a conductive line disposed on a dielectric substrate, each dielectric substrate passing through the housing at opposite sides of the housing, and each dielectric substrate having a conductive ground plane attached to a side of the dielectric substrate that is opposite the conductive line, wherein the transmission line is proximate to and in a magnetically coupled relationship with the dielectric resonator, and wherein the dielectric resonator is disposed between the parallel transmission lines;
a power divider circuit; and
an amplifier circuit connected in parallel with the transmission lines, said amplifier and the transmission lines being commonly connected via the power divider circuit.

* * * * *